(12) United States Patent
Johnson et al.

(10) Patent No.: US 11,543,793 B2
(45) Date of Patent: Jan. 3, 2023

(54) DEVELOPER CRITICAL DIMENSION CONTROL WITH PULSE DEVELOPMENT

(71) Applicant: INTERNATIONAL BUSINESS MACHINES CORPORATION, Armonk, NY (US)

(72) Inventors: Richard C. Johnson, Selkirk, NY (US); Hao Tang, Slingerlands, NY (US); Yongan Xu, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 601 days.

(21) Appl. No.: 16/691,731

(22) Filed: Nov. 22, 2019

(65) Prior Publication Data
US 2020/0089188 A1     Mar. 19, 2020

Related U.S. Application Data

(62) Division of application No. 15/789,067, filed on Oct. 20, 2017, now Pat. No. 10,915,085.

(51) Int. Cl.
| | | |
|---|---|---|
| *G05B 19/402* | (2006.01) | |
| *G03F 7/30* | (2006.01) | |
| *G03F 7/20* | (2006.01) | |
| *B05D 1/00* | (2006.01) | |

(52) U.S. Cl.
CPC ......... *G05B 19/402* (2013.01); *G03F 7/3021* (2013.01); *G03F 7/3028* (2013.01); *G03F 7/70* (2013.01); *B05D 1/005* (2013.01); *G05B 2219/45031* (2013.01)

(58) Field of Classification Search
CPC ........ G03F 7/3021; G03F 7/3028; G03F 7/70; B05D 1/005; G05B 19/402; G05B 2219/45031
See application file for complete search history.

(56) References Cited

U.S. PATENT DOCUMENTS

| | | | |
|---|---|---|---|
| 2,412,397 | A | 12/1946 | Harper |
| 3,215,394 | A | 11/1965 | Sherman |
| 4,199,307 | A | 4/1980 | Jassawalla |
| 4,423,752 | A | 1/1984 | Psarouthakis |
| 4,502,318 | A | 3/1985 | Converse, III et al. |
| 4,524,944 | A * | 6/1985 | Sussman ............ F16K 7/065 251/4 |
| 4,592,379 | A | 6/1986 | Goettl |
| 4,786,028 | A | 11/1988 | Hammond |
| 4,880,149 | A | 11/1989 | Scholefield |

(Continued)

OTHER PUBLICATIONS

List of IBM Patents or Patent Applications Treated as Related; Date Filed: Nov. 22, 2019, 2 pages.

*Primary Examiner* — Peter B Kim
(74) *Attorney, Agent, or Firm* — Cantor Colburn LLP; Abdy Raissinia

(57) ABSTRACT

Embodiments of the invention include methods and structures for controlling developer critical dimension (DCD) variations across a wafer surface. Aspects of the invention include an apparatus having developer tubing and an internal cam. The internal cam is coupled to a fixed axis. A flexible divider is positioned between the developer tubing and the internal cam. The flexible divider is coupled to the internal cam such that rotation of the internal cam about the fixed axis is operable to change an inner diameter of the developer tubing.

15 Claims, 7 Drawing Sheets

(56) References Cited

U.S. PATENT DOCUMENTS

| | | | |
|---|---|---|---|
| 5,009,251 | A | 4/1991 | Pike et al. |
| 5,098,060 | A | 3/1992 | Mogler |
| 5,326,033 | A | 7/1994 | Anfindsen |
| 6,190,063 | B1 | 2/2001 | Akimoto |
| 8,912,489 | B2 | 12/2014 | Wei |
| 8,987,134 | B2 | 3/2015 | Wang et al. |
| 9,227,184 | B2 | 1/2016 | Nakano |
| 2002/0043541 | A1 | 4/2002 | Yabe |
| 2016/0070171 | A1* | 3/2016 | Terashita ............ H01L 21/6715 355/27 |
| 2019/0121316 | A1 | 4/2019 | Johnson et al. |

* cited by examiner

… … …

DEVELOPER CRITICAL DIMENSION CONTROL WITH PULSE DEVELOPMENT

DOMESTIC PRIORITY

This application is a divisional of U.S. patent application Ser. No. 15/789,067, filed Oct. 20, 2017, the disclosure of which is incorporated by reference herein in its entirety.

BACKGROUND

The present invention generally relates to fabrication methods and resulting structures for semiconductor devices. More specifically, the present invention relates to developer critical dimension control with pulse development.

The effort to build integrated circuits with faster semiconductor devices has a resulted in a continued shrinking of device geometries. The smallest possible device geometry or feature size that can be fabricated using a given fabrication process is known as the device critical dimension. Fabrication processes having smaller critical dimensions tend to produce a higher performance or faster switching transistor.

In conventional lithographic techniques, the surface of a silicon substrate wafer is coated with a light sensitive photoresist material that is then exposed to a high intensity light source using a photo mask. The photoresist is developed using a developer, and the excess or unwanted photo resist is removed. The remaining photoresist forms a patterned mask over the surface of the substrate. The patterned photoresist mask then acts a barrier during subsequent etch processes used in the formation of semiconductor or interconnect features in an integrated circuit.

The smallest possible feature size that can be transferred into a patterned photoresist mask is known as the developer critical dimension (DCD), also known as the after-development critical dimension. The uniformity of DCD across a substrate, known as critical dimension uniformity, directly limits the smallest critical dimension of devices formed using a given lithographic technique. In other words, these factors effectively define the resolution limit of photoresist materials.

SUMMARY

Embodiments of the present invention are directed to an apparatus for controlling developer critical dimension (DCD) variations across a wafer surface. A non-limiting example of the apparatus includes developer tubing and an internal cam. The internal cam is coupled to a fixed axis. A flexible divider is positioned between the developer tubing and the internal cam. The flexible divider is coupled to the internal cam such that rotation of the internal cam about the fixed axis is operable to change an inner diameter of the developer tubing.

Embodiments of the present invention are directed to a method for controlling DCD variations across a wafer surface. A non-limiting example of the method includes providing an apparatus having developer tubing and an internal cam coupled to a fixed axis. A flexible divider is positioned between the developer tubing and the internal cam. The flexible divider is coupled to the internal cam such that rotation of the internal cam about the fixed axis is operable to change an inner diameter of the developer tubing. The method includes coupling an end of the developer tubing to a nozzle and positioning the nozzle over a first region of a wafer. The internal cam is rotated to a first position corresponding to a first inner diameter of the developer tubing and developer is dispensed over the first region of the wafer.

Embodiments of the present invention are directed to a method for controlling DCD variations across a wafer surface. A non-limiting example of the method includes depositing a developer over a surface of a wafer. A volumetric flow rate of the developer is adjusted such that a first deposited volume of the developer in a first region of the wafer is higher than a second deposited volume of the developer in a second region of the wafer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
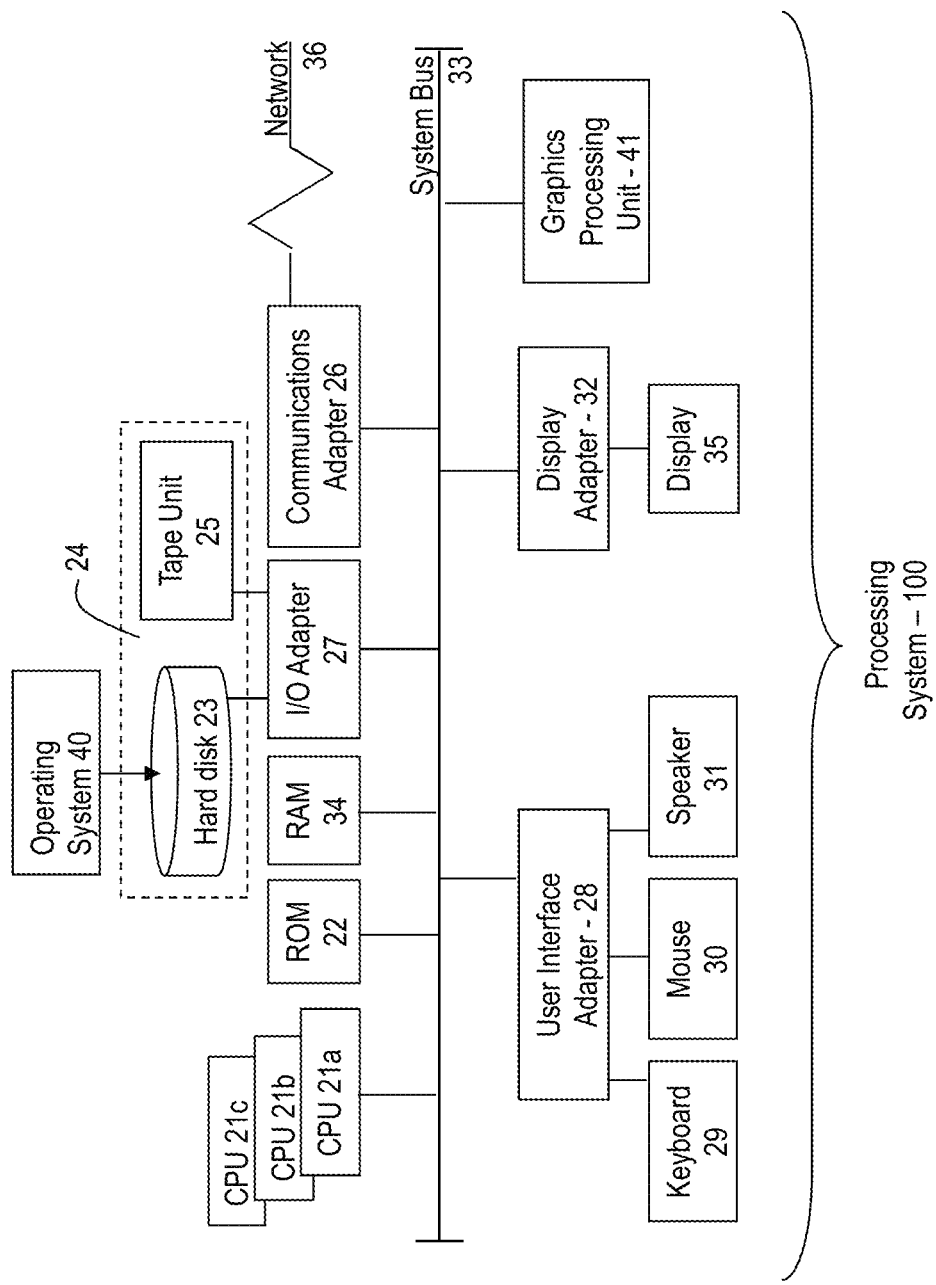
FIG. 1 depicts a block diagram of a computer system for use in implementing one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Referring to FIG. 1, there is shown an embodiment of a processing system 100 for implementing the teachings herein. In this embodiment, the system 100 has one or more central processing units (processors) 21a, 21b, 21c, etc. (collectively or generically referred to as processor(s) 21). In one or more embodiments, each processor 21 can include a reduced instruction set computer (RISC) microprocessor. Processors 21 are coupled to system memory 34 and various other components via a system bus 33. Read only memory (ROM) 22 is coupled to the system bus 33 and can include a basic input/output system (BIOS), which controls certain basic functions of system 100.

FIG. 1 further depicts an input/output (I/O) adapter 27 and a network adapter 26 coupled to the system bus 33. I/O adapter 27 can be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 100 can be stored in mass storage 24. A network adapter 26 interconnects bus 33 with an outside network 36 enabling data processing system 100 to communicate with other such systems. A screen (e.g., a display monitor) 35 is connected to system bus 33 by display adaptor 32, which can include a graphics adapter to improve the performance of graphics intensive applications and a video controller. In one embodiment, adapters 27, 26, and 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which can include, for example, a Super I/O chip integrating multiple device adapters into a single integrated circuit.

In exemplary embodiments, the processing system 100 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 1, the system 100 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 1.

Turning now to an overview of technologies that are more specifically relevant to aspects of the present invention, as previously noted herein, the smallest possible feature size that can be transferred into a substrate by a patterned photoresist mask is effectively limited by the critical dimension uniformity in the developer critical dimension (DCD). In other words, improving these factors is essential to improve the resolution limit of photoresist materials. There are challenges, however, in improving the critical dimension uniformity of the DCD for higher technology nodes (i.e., sub 10 nm). The limitations of conventional lithographic techniques used to pattern transistor gates and interconnects are quickly being realized. Conventional optical and extreme ultraviolet (EUV) lithography processes rely on a constant or nearly constant developer flow dispensed using a developer module arm. To apply the developer, the developer module arm moves from the center to the edge of the wafer, and then back to the center. Accordingly, conventional developer processes are prone to overdevelopment in the center of the wafer, resulting in DCD variations across the wafer surface (i.e., bigger DCD at the wafer center).

Turning now to an overview of the aspects of the invention, one or more embodiments of the invention address the above-described shortcomings of the prior art by providing methods, systems, and computer program products for controlling DCD variations across a wafer surface using pulse development. Pulse development refers to the active control of developer volume dispensed over the wafer surface to greatly improve critical dimension uniformity. Using pulse development, the volume of dispensed developer can be adjusted over time, allowing for developer volume to be increased in a first wafer region and decreased in a second wafer region. For example, developer volume near the center of the wafer can be decreased to account for the increased time the developer module arm spends over the central region. In another example, developer volume can be adjusted to compensate for any defects in the wafer (e.g., wafer topography issues). Advantageously, pulse development according to one or more embodiments of the present invention can be easily incorporated into existing developer lines with a simple retrofit.

Figure 2:
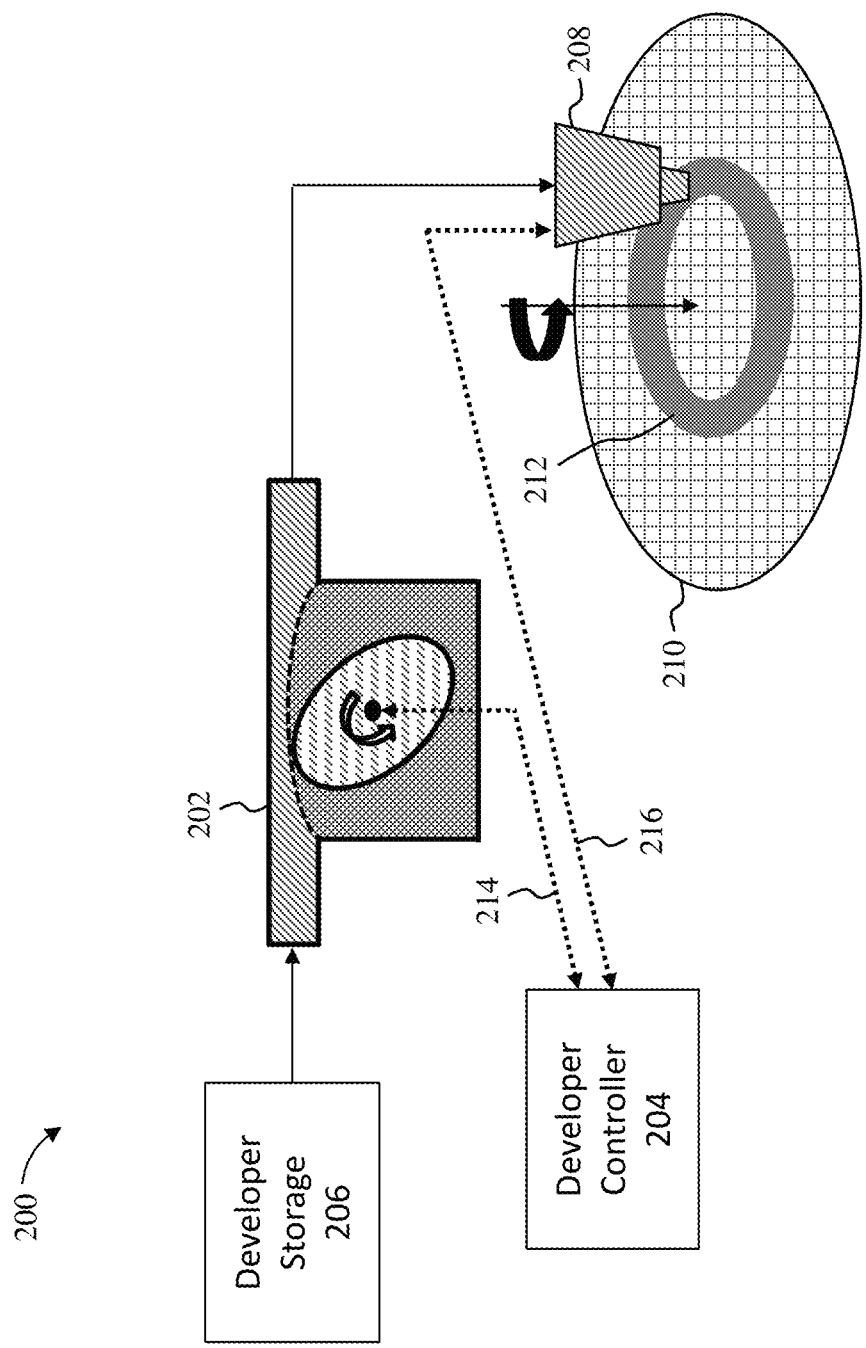
FIG. 2 depicts a block diagram of a system for controlling developer critical dimension (DCD) variations across a wafer surface using pulse development according to one or more embodiments of the present invention.

Turning now to a more detailed description of aspects of the present invention, FIG. 2 depicts a system 200 for controlling DCD variations across a wafer surface using pulse development according to one or more embodiments of the present invention. The system 200 includes a pulse dispenser 202, a developer controller 204, developer storage 206, a developer module arm 208, and a wafer 210. The developer module arm 208 includes a nozzle for dispensing the developer 212 onto a surface of the wafer 210. In one or more embodiments of the invention, the developer controller 204 can be implemented on the processing system 100 found in FIG. 1. In some embodiments of the present invention, a developer pump (not depicted) can be located between the developer storage 206 and the pulse dispenser 202, or between the pulse dispenser 202 and the developer module arm 208. Developer from the developer storage 206 is pumped via the developer pump through the pulse dispenser 202 and the developer module arm 208. In some embodiments of the present invention, the developer pump is a constant pressure pump.

As will be discussed in further detail herein, the pulse dispenser 202 includes an internal cam 300 and a flexible divider 302 (depicted in FIG. 3) for controlling developer flow. As the internal cam 300 actuates, the flexible divider 302 increases or decreases an internal diameter of the pulse dispenser 202. In this manner, developer volumetric flow rate through the pulse dispenser 202 can be increased or decreased by adjusting the position of the internal cam 300. The pulse dispenser 202 receives a cam control signal 214 from the developer controller 204. The developer controller 204 is configured to receive a developer recipe including cam spin speed and position over time. In one or more embodiments of the invention, a user inputs a developer recipe into the developer controller 204 using, for example, the user interface adapter 28 (depicted in FIG. 1). In some embodiments of the present invention, the developer controller 204 accesses a preconfigured developer recipe stored, for example, in mass storage 24 (depicted in FIG. 1). Once received, the developer recipe can be transmitted to the pulse dispenser 202 along the cam control signal 214.

In some embodiments of the present invention, the developer module arm 208 is actuatable over the surface of the wafer 210. In some embodiments of the present invention, the wafer 210 is configured to spin along a fixed axis of rotation beneath the developer module arm 208. In this manner, the nozzle of the developer module arm 208 can be positioned over any portion of the wafer 210 and the entire surface of the wafer 210 can be coated with developer. In some embodiments of the present invention, the developer module arm 208 position is controlled using the developer controller 204. In some embodiments of the present invention, the developer controller 204 receives a position signal 216 from the developer module arm 208. In this manner the developer controller 204 can adjust the internal cam 300 of the pulse dispenser 202 in response to position updates from the developer module arm 208. In other words, the developer controller 204 can increase developer volumetric flow rate during a first position of the developer module arm 208 and decrease developer volumetric flow rate during a second position of the developer module arm 208.

Figure 3:
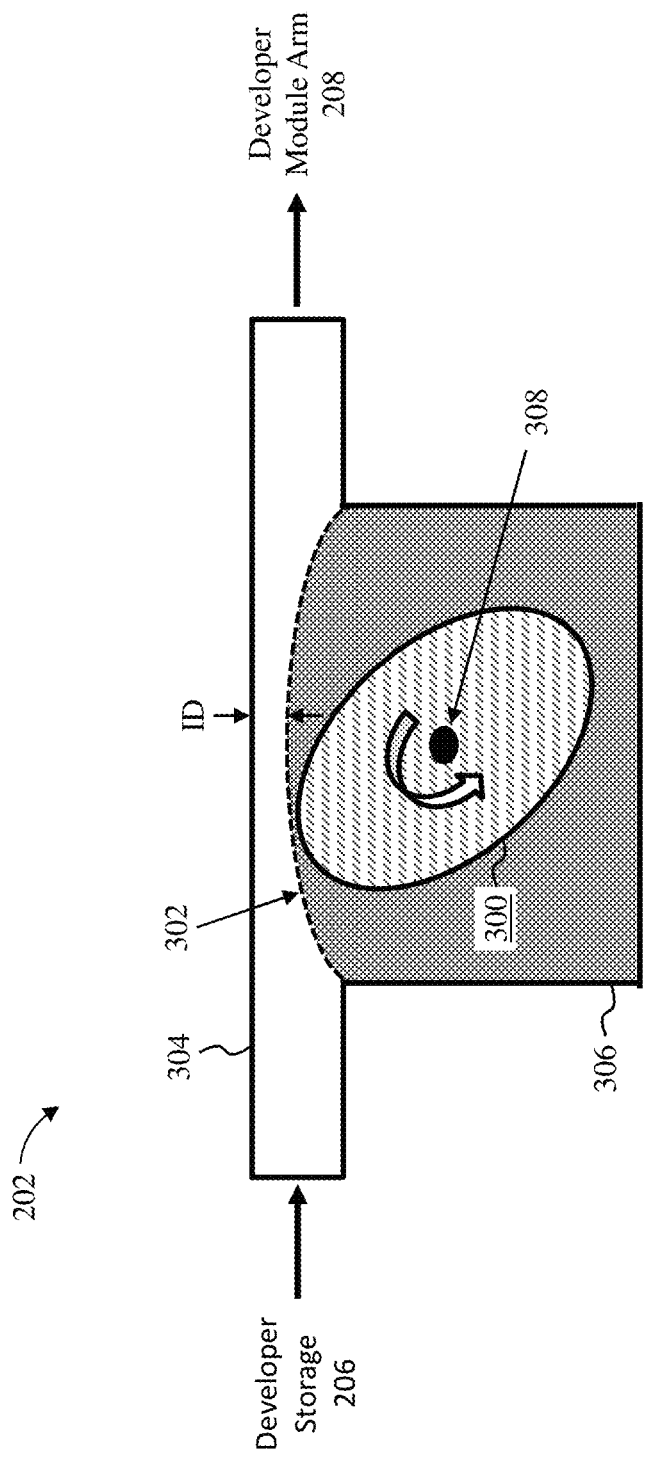
FIG. 3 depicts an illustrative example of a pulse dispenser according to one or more embodiments of the present invention.

FIG. 3 depicts an illustrative example of the pulse dispenser 202 according to one or more embodiments of the present invention. As discussed previously herein, the pulse dispenser 202 receives developer from developer storage 206. The developer flows through tubing 304 of the pulse dispenser 202 before exiting the nozzle of the developer module arm 208. The pulse dispenser 202 includes an internal cam 300 within a housing 306. In some embodiments of the present invention, the internal cam 300 is fastened to a cam shaft 308 and the internal cam 300 rotates about a fixed axis. As depicted, the internal cam 300 rotates about a fixed axis in a single direction. It is understood, however, that the internal cam 300 can rotate about the fixed axis in both clockwise and counter-clockwise directions.

The internal cam 300 and the housing 306 are separated from the developer flowing through the tubing 304 by a flexible divider 302. In some embodiments of the present invention, the flexible divider 302 is affixed to the tubing 304. In some embodiments of the present invention, the flexible divider 302 is affixed to the housing 306. The flexible divider 302 can be made of any suitable elastic or flexible material for handling developer. For example, in aqueous applications (i.e., a non solvent based developer) the flexible divider 302 can be made of rubber or another suitable elastic or flexible material. In solvent based applications the flexible divider 302 can be made of, for example, Teflon. In some embodiments of the present invention, the flexible divider 302 is a Teflon coated elastic material.

The internal cam 300 is irregularly shaped such that rotation of the internal cam 300 about the fixed axis will cause the internal cam 300 to push up against and move an unfixed portion of the flexible divider 302 to various positions within the tubing 304. Consequently, as the flexible divider 302 is moved, an internal diameter (ID) of the tubing 304 is increased or decreased. In some embodiments of the present invention, rotation of the internal cam 300 is operable to position the flexible divider 302 in a fully open position (i.e., the ID of the tubing 300 is not restricted), a fully closed position (i.e., the ID of the tubing 300 is completely restricted), and various partially open positions (i.e., the ID of the tubing 300 is partially restricted). In some embodiments of the present invention, the orientation of the internal cam 300 can be precisely controlled and the ID of the tubing 300 can be smoothly adjusted between 0 percent and 100 percent restricted.

As depicted in FIG. 3, the internal cam 300 has an elliptical or oval shape. It is understood, however, that the internal cam 300 can have any irregular shape capable of positioning the flexible divider 302 at various positions within the tubing 304. For example, the internal cam 300 can have a circular shape with an extending member protruding orthogonally from its surface. In other embodiments of the present invention, the internal cam 300 includes several extending members having different lengths and rotation of the internal cam 300 is operable to position one or more of the extending members against the flexible divider 302.

As discussed previously herein, the position and speed of rotation of the internal cam 300 can be controlled by the developer controller 204 (depicted in FIG. 2). Depending on the instructions in the cam control signal 214, the flexible divider 302 can be continuously or periodically repositioned to increase or decrease the internal diameter of the tubing 304. In this manner, developer flow through the pulse dispenser 202 can be increased or decreased over time.

Figure 4:
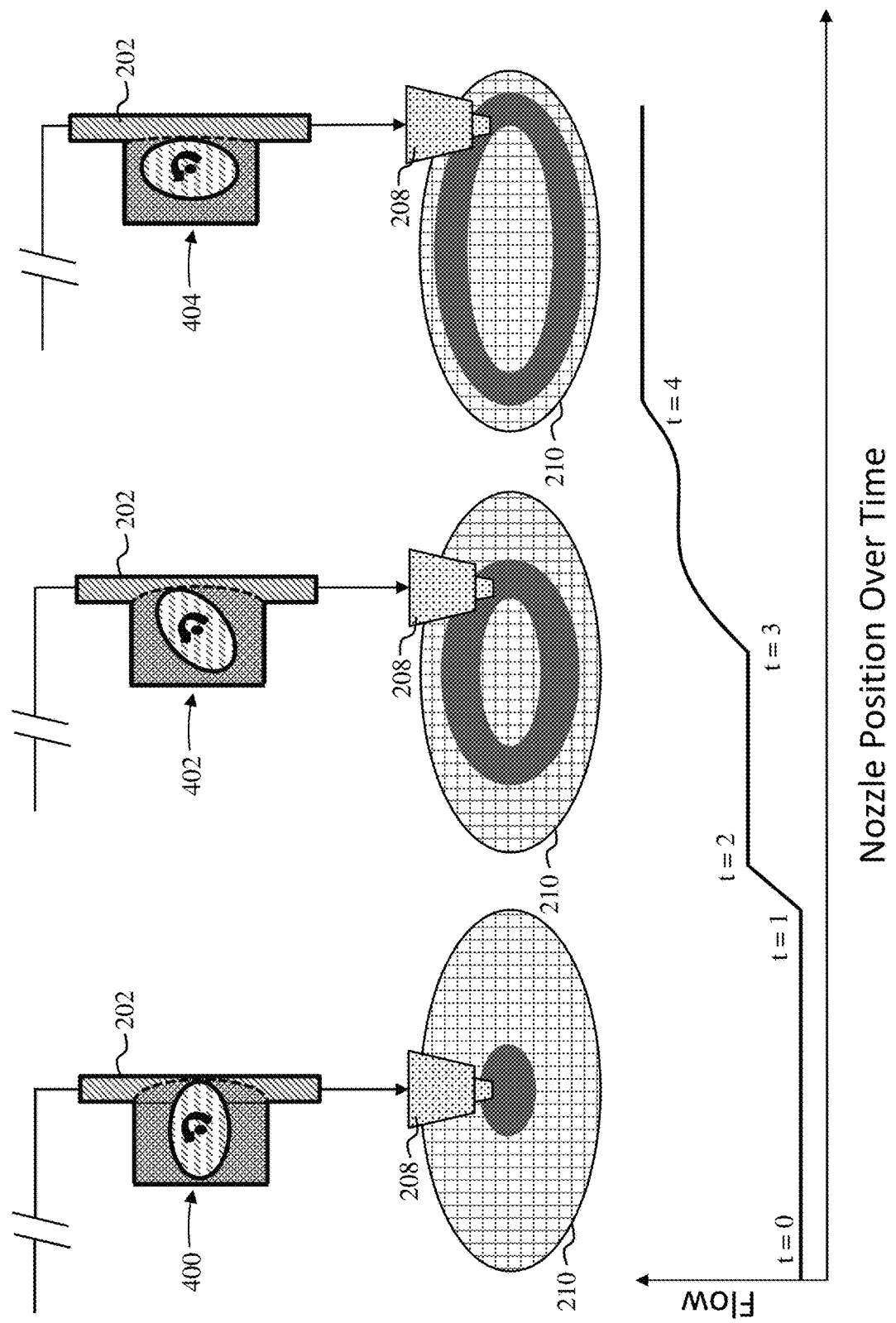
FIG. 4 depicts an illustrative example of a pulse dispenser operating over time according to one or more embodiments of the present invention.

FIG. 4 depicts an illustrative example of the pulse dispenser 202 operating over time according to one or more embodiments of the present invention. As depicted, the pulse dispenser 202 starts (t=0) at a first cam position 400 while the developer module arm 208 is positioned over a central region of the wafer 210. As the developer module arm 208 moves away from the central region of the wafer 210 the cam position rapidly and linearly changes (between t=1 and t=2) to a second cam position 402. The second cam position 402 is maintained (between t=2 and t=3) before gradually and parabolically ramping up (t=3 to t=4) to a third cam position 404. Specific first, second, and third cam positions 400, 402, and 404 at specific times (e.g., t=1) are illustrated for ease of discussion. It is understood, however, that any combination of cam positions is possible and that the cam position can be continuously or periodically adjusted according to one or more embodiments of the present invention. It is further understood that both linear and nonlinear (e.g., parabolic) changes in developer flow rate can be achieved by adjusting the rotation speed of the internal cam 302 according to one or more embodiments of the present invention.

Figure 5:
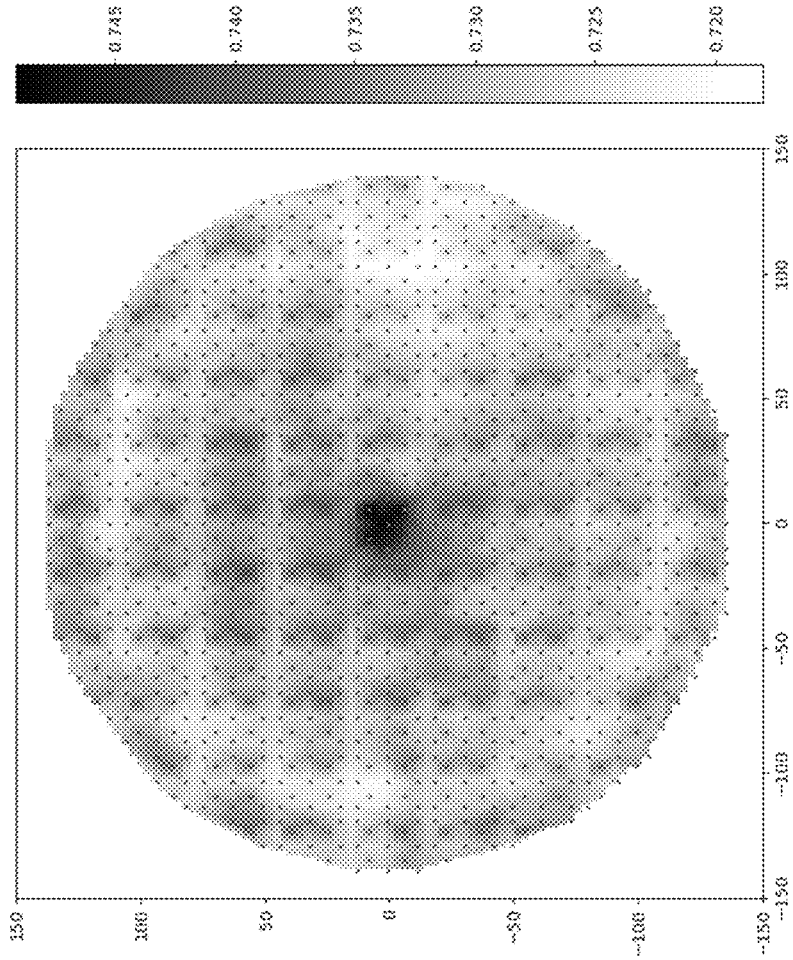
FIG. 5 depicts an illustrative example of a wafer surface after conventional developer processing that is prone to overdevelopment in the wafer center.

FIG. 5 depicts an illustrative example of a wafer surface after conventional developer processing that is prone to overdevelopment in the wafer center. As discussed previously herein, conventional optical and EUV lithography processes rely on a constant or nearly constant developer flow rate. Conventional lithography processes do not account for the developer module arm position, wafer topography, or defects. Accordingly, conventional DCD uniformity is poor. In other words, DCD variations are formed across the wafer surface. In particular, it is common when using conventional lithography processes to have a larger DCD at the wafer center.

Figure 6:
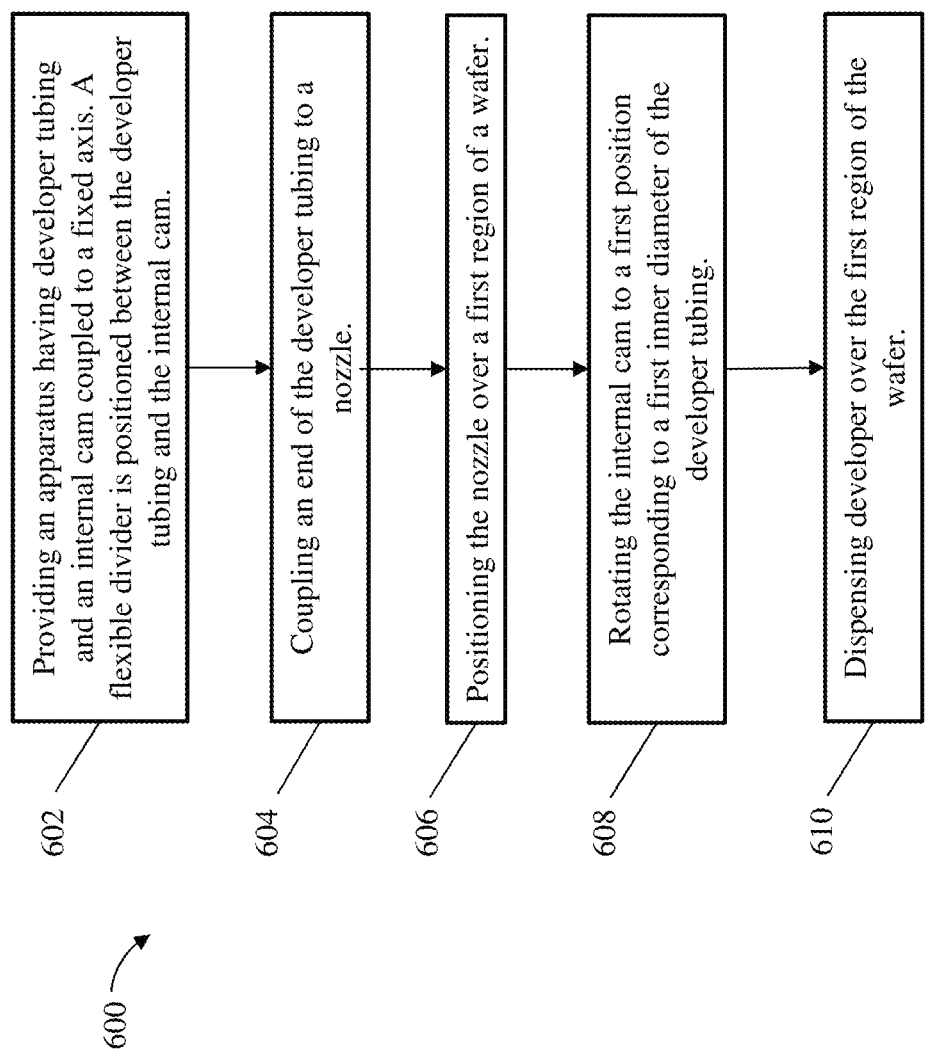
FIG. 6 depicts a flow diagram of a method for controlling DCD variations across a wafer surface using pulse development according to one or more embodiments of the invention.

FIG. 6 depicts a flow diagram of a method for controlling DCD variations across a wafer surface using pulse development according to one or more embodiments of the invention. The method 600 includes providing an apparatus having developer tubing and an internal cam coupled to a fixed axis, as shown at block 602. A flexible divider is positioned between the developer tubing and the internal cam such that rotation of the internal cam about the fixed axis is operable to change an inner diameter of the developer tubing according to one or more embodiments of the present invention.

At block 604, the method 600 includes coupling an end of the developer tubing to a nozzle. At block 606, the nozzle is positioned over a first region of a wafer. The method 600 further includes rotating the internal cam to a first position corresponding to a first inner diameter of the developer tubing according to one or more embodiments of the present invention, at block 608. The method includes, at block 610, dispensing developer over the first region of the wafer. As discussed previously herein, the volumetric flow rate of the dispensed developer is limited by the first inner diameter.

Figure 7:
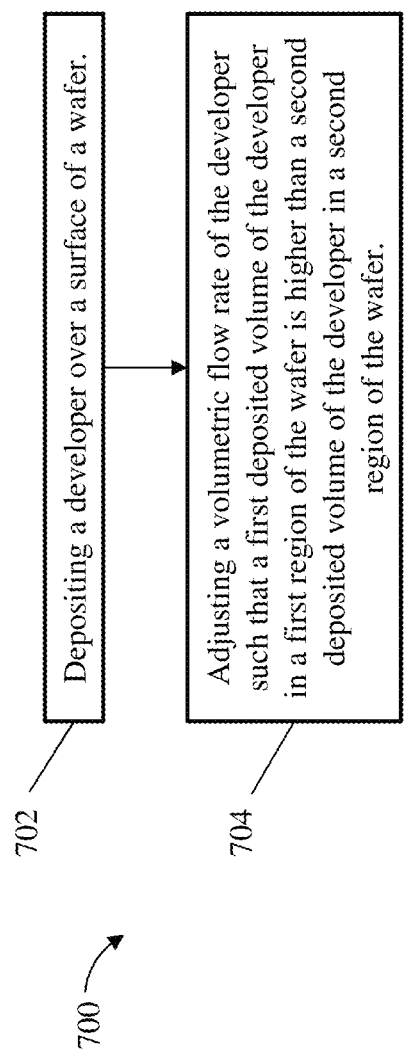
FIG. 7 depicts a flow diagram of a method for controlling DCD variations across a wafer surface using pulse development according to one or more embodiments of the invention.

FIG. 7 depicts a flow diagram of a method for controlling DCD variations across a wafer surface using pulse development according to one or more embodiments of the invention. The method 700 includes depositing a developer over a surface of a wafer, as shown at block 702. In some embodiments of the present invention, the developer is deposited from a nozzle positioned over the wafer as depicted in FIG. 2.

At block 704, the method 700 includes adjusting a volumetric flow rate of the developer such that a first deposited volume of the developer in a first region of the wafer is higher than a second deposited volume of the developer in a second region of the wafer. As discussed previously herein, the volumetric flow rate of the developer can be adjusted by changing an inner diameter of developer tubing according to one or more embodiments of the present invention. For example, an internal cam can be rotated to various positions to continuously or periodically deform a flexible divider as illustrated in FIG. 4.

Additional processes can also be included. It should be understood that the processes depicted in FIGS. 6 and 7 represent illustrations and that other processes can be added or existing processes can be removed, modified, or rearranged without departing from the scope and spirit of the present disclosure.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An apparatus for controlling developer critical dimension (DCD) variations across a wafer surface, the apparatus comprising:
    a developer controller;
    developer tubing;
    an internal cam coupled to a fixed axis, the internal cam comprising a non-uniform radius, the internal cam communicatively coupled to the developer controller; and
    a flexible divider between the developer tubing and the internal cam;
    wherein the flexible divider is coupled to the internal cam such that rotation of the internal cam about the fixed axis variably depresses the flexible divider into the developer tubing to change an inner diameter of the developer tubing through which developer flows; and
    wherein the developer controller is configured to linearly and parabolically change a flow rate of the developer by actuating the internal cam.

2. The apparatus of claim 1, wherein rotation of the internal cam about the fixed axis deforms the flexible divider.

3. The apparatus of claim 2, wherein deforming the flexible divider displaces a portion of the flexible divider into a portion of the developer tubing.

4. The apparatus of claim 1, wherein rotation of the internal cam to a first position corresponds to a first inner diameter of the developer tubing and rotation of the internal cam to a second position corresponds to a second inner diameter of the developer tubing.

5. The apparatus of claim 1, wherein the first and second inner diameters are dissimilar.

6. The apparatus of claim 1, wherein the internal cam comprises an elliptical or oval shape.

7. The apparatus of claim 1, wherein the flexible divider comprises an elastic material.

8. The apparatus of claim 1, wherein the internal cam can rotate about the fixed axis in a clockwise or counter-clockwise direction.

9. The apparatus of claim 1, wherein a rotation speed and a position of the internal cam is remotely programmable.

10. A system for controlling developer critical dimension (DCD) variations across a wafer surface, the system comprising:
   an apparatus comprising:
      developer tubing;
      an internal cam coupled to a fixed axis, the internal cam comprising a non-uniform radius, the internal cam communicatively coupled to a developer controller; and
      a flexible divider between the developer tubing and the internal cam, the flexible divider coupled to the internal cam such that rotation of the internal cam about the fixed axis variably depresses the flexible divider into the developer tubing to change an inner diameter of the developer tubing through which developer flows;
   a developer module arm comprising a nozzle, the developer module arm actuatable over the wafer surface, the nozzle coupled to an end of the developer tubing; and
   the developer controller comprising a processor configured to:
      position the nozzle over a first region of the wafer surface; and
      generate a cam control signal to rotate the internal cam to a first position corresponding to a first inner diameter of the developer tubing;
   wherein the developer controller is configured to linearly and parabolically change a flow rate of the developer by actuating the internal cam.

11. The system of claim 10, wherein the processor is further configured to position the nozzle over a second region of the wafer surface.

12. The system of claim 11, wherein the processor is further configured to rotate the internal cam to a second position corresponding to a second inner diameter between the developer tubing and the flexible divider.

13. The system of claim 12, wherein the apparatus is configured to dispense developer over the second region of the wafer surface.

14. The system of claim 13, wherein developer is dispensed at a first volumetric flow rate over the first region of the wafer and at a second volumetric flow rate over the second region of the wafer.

15. The system of claim 11, wherein the first region of the wafer is an inner region and the second region of the wafer is an outer region.

* * * * *